(12) United States Patent
Kita

(10) Patent No.: US 8,941,201 B2
(45) Date of Patent: Jan. 27, 2015

(54) DISPLAY PANEL AND DISPLAY DEVICE

(71) Applicant: Panasonic Liquid Crystal Display Co., Ltd., Himeji-shi, Hyogo (JP)

(72) Inventor: Kazuo Kita, Osaka (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 76 days.

(21) Appl. No.: 13/708,225

(22) Filed: Dec. 7, 2012

(65) Prior Publication Data

US 2013/0146867 A1 Jun. 13, 2013

(30) Foreign Application Priority Data

Dec. 12, 2011 (JP) .................. 2011-271138

(51) Int. Cl.
*H01L 29/786* (2006.01)
*H01L 27/12* (2006.01)

(52) U.S. Cl.
CPC ........ *H01L 29/786* (2013.01); *H01L 29/78633* (2013.01); *H01L 29/7869* (2013.01); *H01L 27/1225* (2013.01)
USPC .................. 257/435; 257/E33.064

(58) Field of Classification Search
CPC .......... H01L 29/786; H01L 29/78633
USPC .............. 257/435, E33.064; 349/42
See application file for complete search history.

(56) References Cited

U.S. PATENT DOCUMENTS

| 2010/0165255 A1 | 7/2010 | Ishitani et al. |
| 2012/0132904 A1* | 5/2012 | Yamazaki ............... 257/43 |

FOREIGN PATENT DOCUMENTS

JP 2010-170119 8/2010

* cited by examiner

*Primary Examiner* — Caridad Everhart
(74) *Attorney, Agent, or Firm* — Hamre, Schumann, Mueller & Larson, P.C.

(57) ABSTRACT

In a transparent substrate (10), there are formed a semiconductor layer (14) formed of an oxide semiconductor, the semiconductor layer (14) functioning as a channel portion of a TFT (2); an electrode (16) formed of a transparent conductive material and located over the semiconductor layer (14), and a light-shielding conductor (17) formed on the electrode (16), the light-shielding conductor being formed of a material which has a conductivity higher than that of the transparent conductive material and which has light-shielding property, the light-shielding conductor covering the semiconductor layer (14). This structure can inhibit exposure of the oxide semiconductor which forms the channel portion toward a light, and can lower the resistance of the electrode formed of the transparent conductive material.

12 Claims, 8 Drawing Sheets

DISPLAY PANEL AND DISPLAY DEVICE

CROSS-REFERENCE TO RELATED APPLICATION

The present application claims priority from Japanese application JP 2011-271138 filed on Dec. 12, 2011, the content of which is hereby incorporated by reference into this application.

BACKGROUND OF THE INVENTION

1. Field of the Invention

The present invention relates to a display panel and a display device in which an oxide semiconductor is used in a channel portion of a thin film transistor.

2. Description of the Related Art

Japanese Patent Application Laid-open No. 2010-170119 discloses a liquid crystal display panel in which an oxide semiconductor is used in a channel portion of a thin film transistor (hereinafter referred to as TFT). An oxide semiconductor is liable to be deteriorated by ultraviolet ray. In Japanese Patent Application Laid-open No. 2010-170119, a light-shielding layer for preventing application of light to the oxide semiconductor is provided to a transparent substrate.

SUMMARY OF THE INVENTION

By the way, an electrode formed of a transparent conductive material is formed on a transparent substrate of a liquid crystal display panel. It is desired that the electrode have a low resistance. For example, in order to realize satisfactory image quality, it is desired that a common electrode have a low resistance and thereby the electric potential of the common electrode is uniform in the entire liquid crystal display panel.

An embodiment of the present invention provides a display panel and a display device which can prevent an oxide semiconductor from being exposed toward a light and which can lower the resistance of an electrode formed of a transparent conductive material.

(1) A display panel according to an embodiment of the present invention includes: a transparent substrate having a thin film transistor formed therein; a semiconductor layer formed of an oxide semiconductor, the semiconductor layer functioning as a channel portion of the thin film transistor; an electrode formed of a transparent conductive material, the electrode being provided to the transparent substrate and located over the semiconductor layer; and a light-shielding conductor formed on the electrode and covering the semiconductor layer, the light-shielding conductor being formed of a material which has a conductivity higher than a conductivity of the transparent conductive material and has a light-shielding property. Further, a display device according to an embodiment of the present invention includes the above-mentioned display panel. According to the embodiments, the light-shielding conductor can inhibit exposure of the oxide semiconductor toward a light, and the resistance of the electrode formed of the transparent conductive material can be lowered.

(2) According to an exemplary embodiment of the present invention, the thin film transistor may be employed as a transistor provided in a pixel of the transparent substrate; and the electrode may be employed as a common electrode. According to this exemplary embodiment, non-uniformity of the electric potential of the common electrode can be inhibited.

(3) The transparent substrate may have a gate electrode line formed therein, the gate electrode line being connected to the thin film transistor, and the light-shielding conductor may extend along the gate electrode line. According to this structure, non-uniformity of the electric potential of the common electrode in the direction of extension of the gate electrode line can be inhibited. Further, by forming the light-shielding conductor, lowering of the aperture ratio of the pixel can be inhibited.

(4) Further, the entirety of the semiconductor layer may be covered by the light-shielding conductor and the gate electrode line. According to this structure, exposure of the semiconductor layer toward a light can be inhibited more effectively.

(5) Further, the transparent substrate may have a pixel electrode formed therein, and the light-shielding conductor and the common electrode may be formed in a layer which is lower than the pixel electrode. According to this structure, compared with a structure in which the light-shielding conductor and the common electrode are formed in a layer which is higher than the pixel electrode, the distance between the light-shielding conductor and the semiconductor layer can be reduced. As a result, exposure of the semiconductor layer toward a light can be inhibited more effectively.

(6) Further, the transparent substrate may have an alignment film formed by photo-alignment treatment; and the light-shielding conductor may be formed in a layer which is lower than the alignment film. According to this structure, exposure of the semiconductor layer toward a light used in a step of forming the alignment film can be inhibited.

(7) According to another exemplary embodiment of the present invention, the transparent substrate may have an electrode line formed in a display region thereof; the thin film transistor may be employed as a transistor which is formed in a peripheral region outside the display region and which is connected to an end of the electrode line; and the light-shielding conductor and the electrode on which the light-shielding conductor may be formed cover the semiconductor layer of the thin film transistor formed in the peripheral region. According to this exemplary embodiment, exposure of the semiconductor layer of the thin film transistor forming a circuit formed in the peripheral region of the transparent substrate toward a light can be inhibited.

(8) In this exemplary embodiment, the transparent substrate may have a common electrode formed in the display region thereof; and the electrode on which the light-shielding conductor is formed may be formed in the peripheral region of the transparent substrate and may be connected to the common electrode. According to this structure, an unnecessary electric field formed by driving the thin film transistor formed in the peripheral region of the transparent substrate can be blocked by the electrode formed in the peripheral region. As a result, for example, in a liquid crystal display panel, the effect of the unnecessary electric field on the driving of a liquid crystal layer in a pixel region can be inhibited.

(9) The display panel may further include: a first thin film transistor provided in a pixel in the display region of the transparent substrate; a semiconductor layer formed of an oxide semiconductor, the semiconductor layer functioning as a channel portion of the first thin film transistor; a first light-shielding conductor formed on the common electrode, for covering the semiconductor layer of the first thin film transistor; a second thin film transistor which functions as the thin film transistor formed in the peripheral region of the transparent substrate; and a second light-shielding conductor which functions as the light-shielding conductor that covers the semiconductor layer forming the second thin film transistor, the second light-shielding conductor being connected to the first light-shielding conductor. According to this structure, exposure of the semiconductor layer of the first thin film transistor formed in the display region toward a light can be inhibited, and, exposure the semiconductor layer of the second thin film transistor formed in the peripheral region of the transparent substrate toward can also be inhibited.

(10) Further, the first light-shielding conductor may extend in a direction of extension of the electrode line, and the second light-shielding conductor may extend in a direction orthogonal to the direction of extension of the electrode line. According to this structure, non-uniformity of the potential of the common electrode can be inhibited both in the direction of extension of the electrode line and in the direction orthogonal thereto.

(11) Further, in the exemplary embodiment of the Item (7), the peripheral region of the transparent substrate may have a first gate electrode line formed in a layer which is lower than the semiconductor layer; and a second gate electrode line which faces the first gate electrode line in a thickness direction of the transparent substrate and which functions as the electrode on which the light-shielding conductor is formed. According to this structure, the performance of the thin film transistor formed in the peripheral region of the transparent substrate can be improved.

(12) The display panel may further include: a first thin film transistor provided in a pixel in the display region of the transparent substrate; a semiconductor layer formed of an oxide semiconductor, the semiconductor layer functioning as forming a channel portion of the first thin film transistor; an electrode formed in the display region of the transparent substrate; a first light-shielding conductor formed on the electrode in the display region, for covering the semiconductor layer of the first thin film transistor; a second thin film transistor which functions as the thin film transistor formed in the peripheral region of the transparent substrate; and a second light-shielding conductor formed on the second gate electrode line, for covering the semiconductor layer forming the second thin film transistor. According to this structure, exposure of the semiconductor layer of the first thin film transistor formed in the display region toward a light can be inhibited, and, exposure the semiconductor layer of the second thin film transistor formed in the peripheral region of the transparent substrate toward a light can also be inhibited.

DETAILED DESCRIPTION OF THE INVENTION

Figure 1:
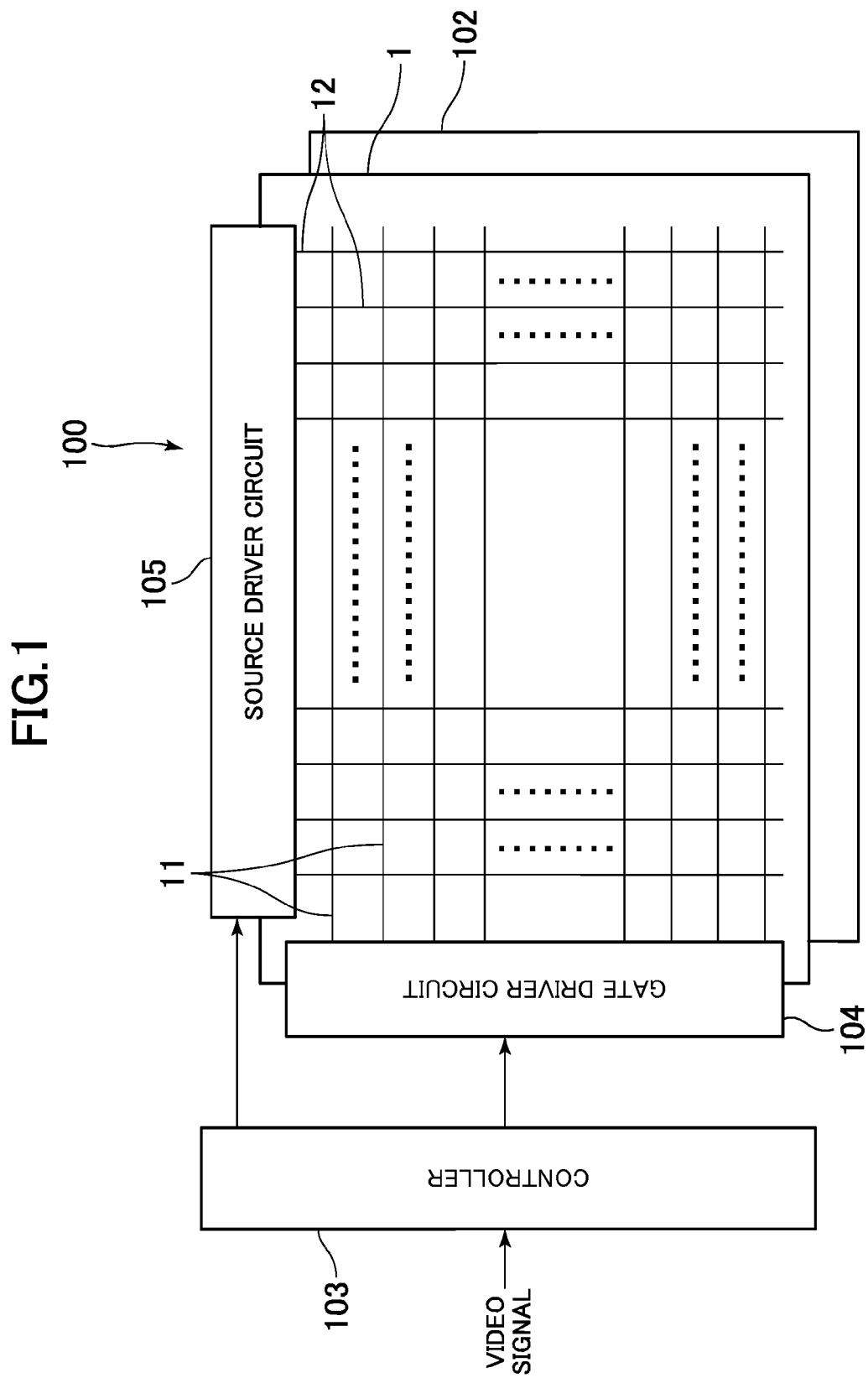
FIG. 1 is a schematic view of a liquid crystal display device according to an embodiment of the present invention.

An embodiment of the present invention is described in the following with reference to the attached drawings. FIG. 1 is a schematic view of a liquid crystal display device 100 according to the embodiment of the present invention.

As illustrated in FIG. 1, the liquid crystal display device 100 includes a liquid crystal display panel 1 and a backlight device 102 for illuminating to a back surface of the liquid crystal display panel 1. The liquid crystal display device 100 further includes a controller 103, a gate driver circuit 104, and a source driver circuit 105. A video signal is input to the controller 103 from a peripheral device. The controller 103 generates a timing control signal from the video signal, and outputs the timing control signal to the gate driver circuit 104. Based on the timing control signal, the gate driver circuit 104 applies a gate voltage to a gate electrode line 11 to be described later. Further, the controller 103 generates from the video signal a signal indicating a gray scale value of each pixel of the liquid crystal display panel 1, and outputs the signal to the source driver circuit 105. Based on the input signal, the source driver circuit 105 applies a pixel voltage corresponding to the gray scale value to a source electrode line 12 to be described later.

First Embodiment

Figure 2:
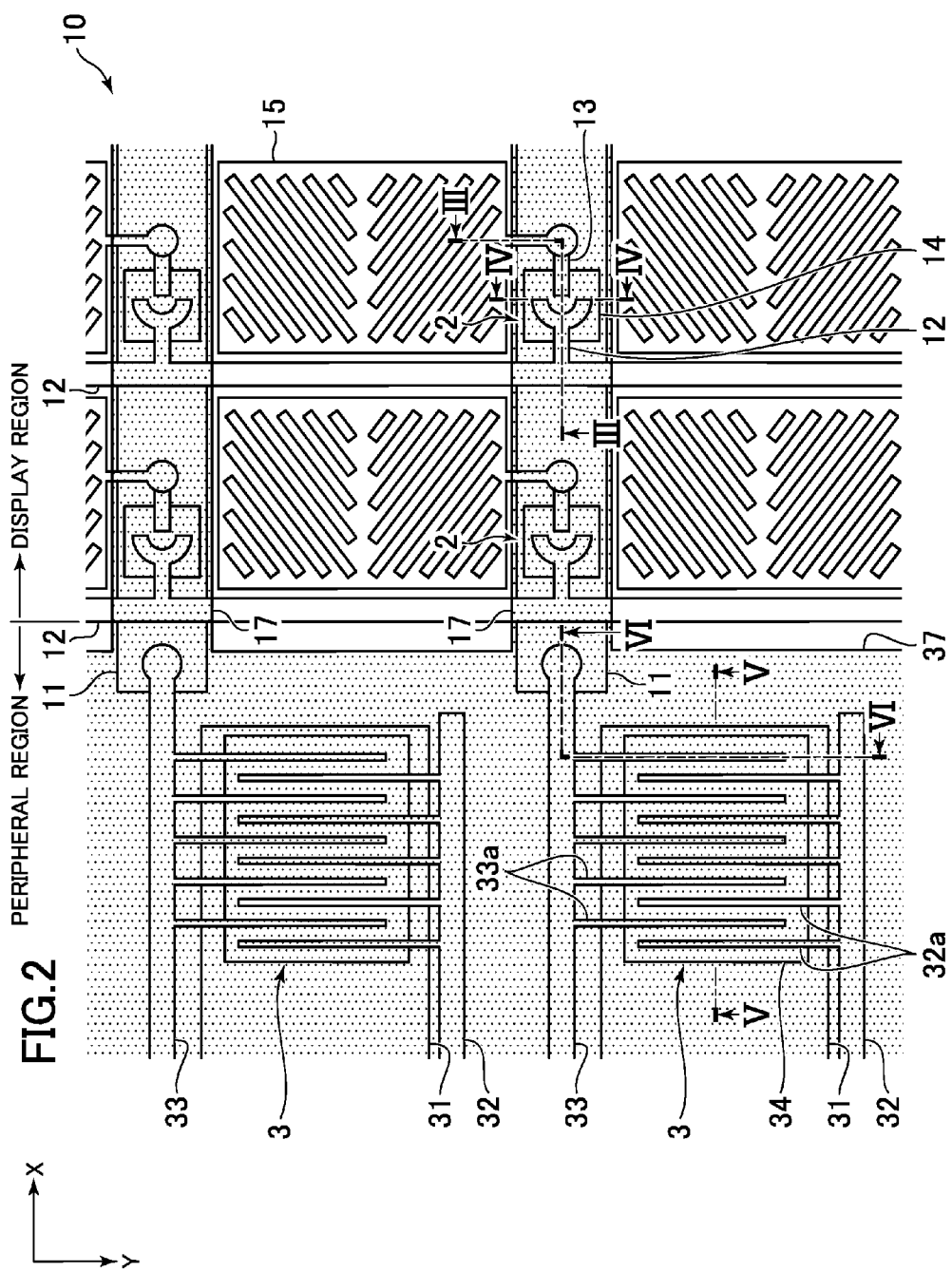
FIG. 2 is a plan view of a first transparent substrate composing a liquid crystal display panel according to a first embodiment of the present invention.
Figure 3:
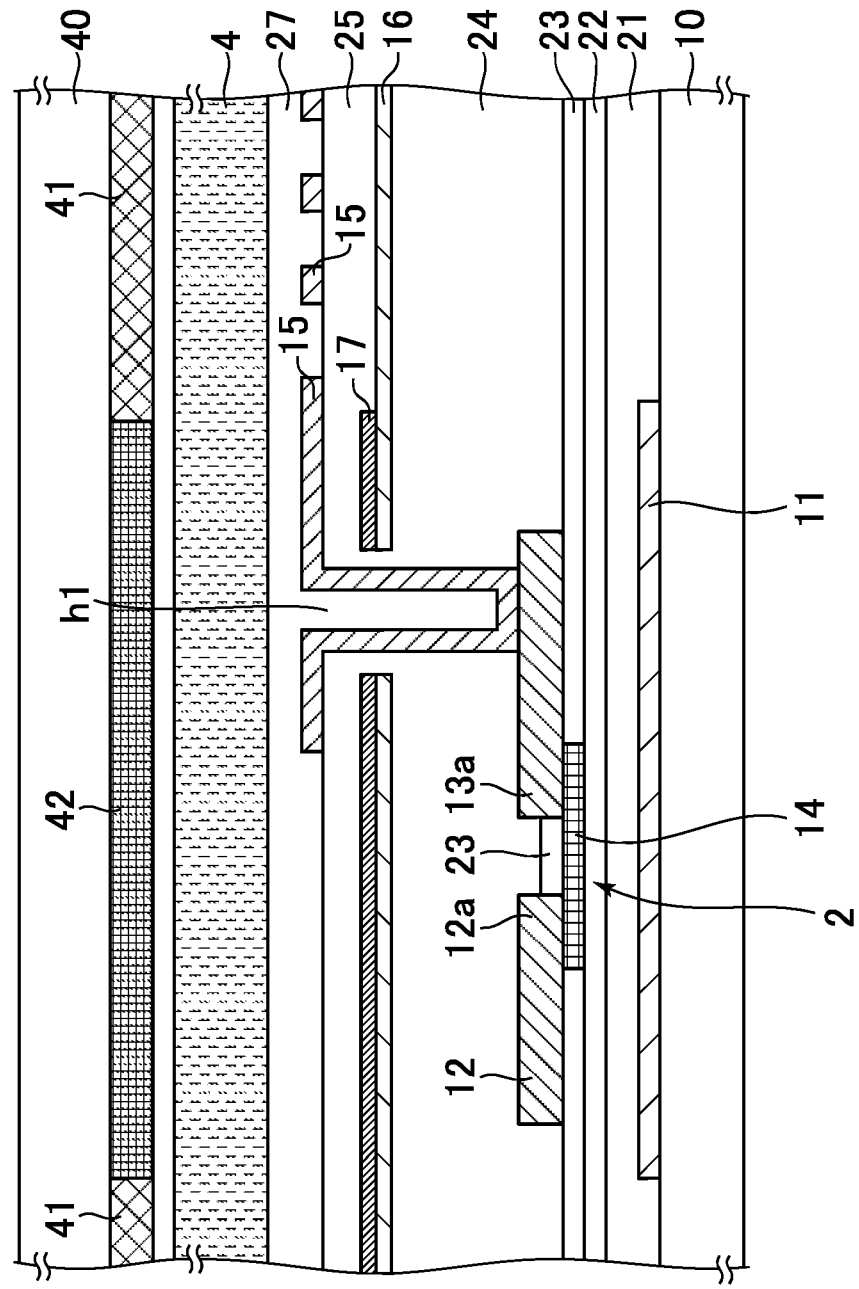
FIG. 3 is a sectional view of the liquid crystal display panel taken along the line III-III of FIG. 2.
Figure 4:
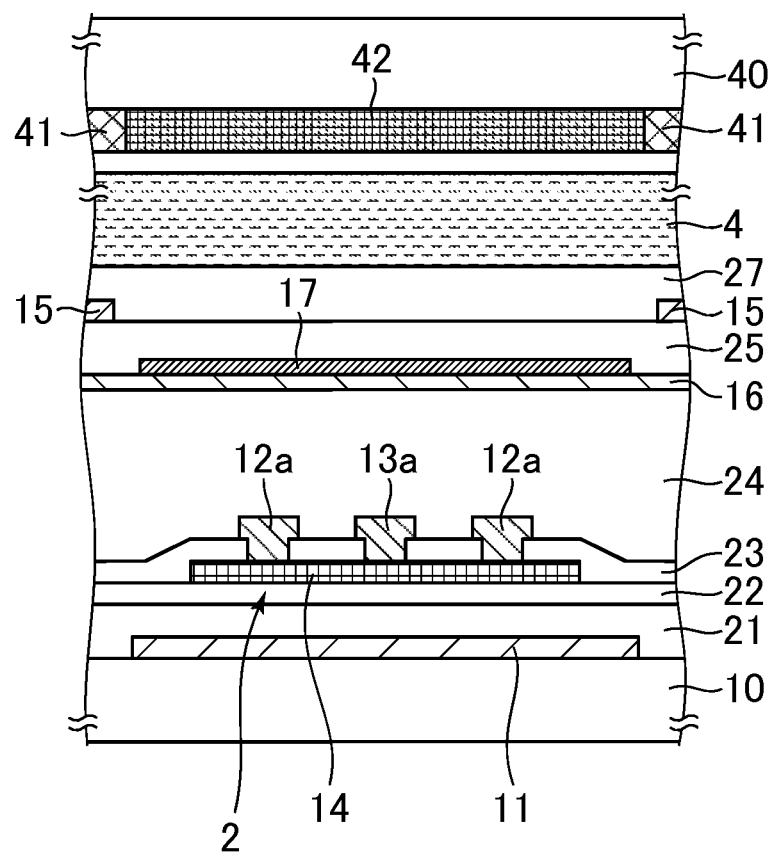
FIG. 4 is a sectional view of the liquid crystal display panel taken along the line IV-IV of FIG. 2.

FIG. 2 is a plan view of a first transparent substrate 10 composing the liquid crystal display panel 1 according to a first embodiment of the present invention. FIG. 3 and FIG. 4 are sectional views of the liquid crystal display panel 1 taken along the line III-III and the line IV-IV, respectively, of FIG. 2. FIG. 2 shows a display region in which pixels are formed, and a peripheral region (region outside the display region) of the first transparent substrate 10. In FIG. 2, thin film transistors 3 which are formed in the peripheral region and which compose the gate driver circuit 104 (specifically, a shift register circuit) are illustrated.

As illustrated in FIG. 3 and FIG. 4, the liquid crystal display panel 1 includes the first transparent substrate 10 and a second transparent substrate 40 which faces each other. The transparent substrates 10 and 40 are, for example, glass substrates or plastic substrates. A liquid crystal layer 4 is formed between the first transparent substrate 10 and the second transparent substrate 40.

As illustrated in FIG. 3, a color filter 41 is formed on the second transparent substrate 40. The color filter 41 is provided in each pixel. A black matrix 42 is formed along a border of two color filters 41 adjacent to each other.

As illustrated in FIG. 1 and FIG. 2, a plurality of gate electrode lines 11 and a plurality of source electrode lines 12 are formed in the display region of the first transparent substrate 10. The source electrode lines 12 and the gate electrode lines 11 extend in directions orthogonal to each other to be lattice-like. Each pixel is surrounded by two source electrode lines 12 adjacent to each other and two gate electrode lines 11 adjacent to each other. A gate voltage is applied to the gate electrode line 11 from the thin film transistor 3 formed in the peripheral region. The gate voltage is applied to the plurality of gate electrode lines 11 in sequence. A pixel voltage corresponding to the gray scale value of each pixel is applied from the source driver circuit 105 to the source electrode line 12. The electrode lines 11 and 12 are formed of, for example, Cu or Al.

As illustrated in FIG. 3, the gate electrode line 11 in this example is formed on the first transparent substrate 10. Specifically, the gate electrode line 11 is formed in a lowest layer in a stacked structure formed on the first transparent substrate 10. The gate electrode line 11 is covered with a gate insulating film 21. The gate insulating film 21 is, for example, a nitride film (for example, SiNx). However, the material of the gate insulating film 21 is not necessarily limited thereto. A first protective insulating film 22 is formed on the gate insulating film 21, and a second protective insulating film 23 is formed on the first protective insulating film 22. The first protective insulating film 22 and the second protective insulating film 23 are insulating films for protecting a semiconductor layer 14 to be described later. The source electrode line 12 is formed on the second protective insulating film 23.

As illustrated in FIG. 3, a pixel electrode 15 and a thin film transistor (hereinafter referred to as TFT) 2 connected to the pixel electrode 15 are formed in each pixel. The liquid crystal display panel 1 is of the in-plane switching (IPS) mode. Therefore, the first transparent substrate 10 is provided with a common electrode 16 in addition to the pixel electrode 15. One common electrode 16 extends throughout a plurality of pixels (for example, all the pixels). The pixel electrode 15 and the common electrode 16 are formed of a transparent conductive material (for example, indium tin oxide (ITO) or zinc oxide). The pixel electrode 15 and the common electrode 16 face each other in the thickness direction of the first transparent substrate 10. In this example, the pixel electrode 15 is formed in a layer which is higher than the common electrode 16, that is, a layer which is nearer to the liquid crystal layer 4 than the common electrode 16 is. Each pixel electrode 15 has slits formed therein. On the other hand, the common electrode 16 in this example does not have a slit formed therein, and has a uniform thickness in its entire region.

As illustrated in FIG. 3 and FIG. 4, the TFT 2 includes the semiconductor layer 14 which functions as a channel portion of TFT 2. Further, the TFT 2 includes a source electrode 12a and a drain electrode 13a which are formed on the semiconductor layer 14. The source electrode 12a extends from the source electrode line 12. The drain electrode 13a is connected to the pixel electrode 15.

The semiconductor layer 14 is formed of an oxide semiconductor. Specifically, the semiconductor layer 14 is formed of a transparent amorphous oxide semiconductor. The transparent amorphous oxide semiconductor is, for example, a semiconductor including In, Ga, and Zn (for example, $InGaZnO_4$). As illustrated in FIG. 4, the semiconductor layer 14 is formed on the first protective insulating film 22, and is covered with the second protective insulating film 23. The source electrode 12a and the drain electrode 13a are held in contact with the semiconductor layer 14 via through holes formed in the second protective insulating film 23. The protective insulating films 22 and 23 are, for example, oxide films (for example, silicon oxide). An oxide film can suitably protect an oxide semiconductor.

The common electrode 16 includes a portion located above the semiconductor layer 14 (that is, a portion located between the liquid crystal layer 4 and the semiconductor layer 14), and covers the semiconductor layer 14. As illustrated in FIG. 3 and FIG. 4, a light-shielding conductor 17 is formed on the common electrode 16. Specifically, the light-shielding conductor 17 is formed on one surface of the common electrode 16 toward the liquid crystal layer 4. The light-shielding conductor 17 and the common electrode 16 are held in contact with each other. The light-shielding conductor 17 is formed of a material which has a conductivity higher than that of the transparent conductive material used as the material of the common electrode 16 and light-shielding property. The material of the light-shielding conductor 17 is, for example, Cu, Al, Cr, or Mo. The satisfactory conductivity of the light-shielding conductor 17 can lower the resistance of the common electrode 16. As a result, non-uniformity of the potential of the common electrode 16 can be prevented.

As illustrated in FIG. 2, the light-shielding conductor 17 is linear and extends along the gate electrode line 11. Therefore, non-uniformity of the potential of the common electrode 16 in the direction of extension of the gate electrode line 11 (X direction in FIG. 2) can be prevented. Further, the light-shielding conductor 17 is located over the gate electrode line 11. Specifically, the light-shielding conductor 17 overlaps with the gate electrode line 11. This layout of the light-shielding conductor 17 can prevents the light-shielding conductor 17 from being a factor in lowering the aperture ratio of the pixel. The length of the light-shielding conductor 17 in this example corresponds to the length of the gate electrode line 11. In other words, the light-shielding conductor 17 has a length equivalent to the length of the gate electrode line 11. Therefore, non-uniformity of the potential of the common electrode 16 can be prevented more effectively.

As described above, the material of the light-shielding conductor 17 blocks light. The light-shielding conductor 17 is located above the semiconductor layer 14 and covers the semiconductor layer 14. Specifically, the light-shielding conductor 17 overlaps with the semiconductor layer 14. As a result, the semiconductor layer 14 can be prevented from being exposed toward a light by the light-shielding conductor 17.

The first transparent substrate 10 has an alignment film 27 in its uppermost layer, that is, in a layer held in contact with the liquid crystal layer 4. In this example, the alignment film 27 is formed by photo-alignment treatment. Specifically, molecules forming the alignment film 27 are aligned using light (more specifically, ultraviolet ray). The light-shielding conductor 17 and the common electrode 16 are formed in a layer which is lower than the alignment film 27, that is, a layer which is nearer to the semiconductor layer 14 and the first transparent substrate 10 than the alignment film 27 is. Therefore, in a manufacturing step of forming the alignment film 27 using ultraviolet ray, the semiconductor layer 14 can be prevented from being exposed toward the ultraviolet ray.

In a manufacturing process, the semiconductor layer 14 and a semiconductor layer 34 to be described later are formed on the first protective insulating film 22. After that, the second protective insulating film 23 is formed on the semiconductor layers 14 and 34, and then, the source electrode line 12, the drain electrode 13a, and a source electrode line 32 and a drain electrode line 33 to be described later are formed on the second protective insulating film 23. After that, an insulating film 24 to be described later, the common electrode 16, the light-shielding conductor 17, an insulating film 25, and the pixel electrode 15 are formed in this order. Finally, the alignment film 27 is formed on the pixel electrode 15, and then the molecules of the alignment film 27 are aligned using ultraviolet ray. At this time, the semiconductor layer can be prevented from being the ultraviolet ray by the light-shielding conductor 17.

As illustrated in FIG. 2 and FIG. 3, the semiconductor layer 14 is located above the gate electrode line 11. Specifically, the semiconductor layer 14 is formed in a layer which is nearer to the liquid crystal layer 4 than the gate electrode line 11 is, and overlaps with the gate electrode line 11. The gate electrode line 11 is also formed of a material which has light-shielding property (for example, the above-mentioned Cu or Al).

Therefore, the gate electrode line 11 also prevent exposure of the semiconductor layer 14 toward a light.

As illustrated in FIG. 4, both the width of the light-shielding conductor 17 and the width of the gate electrode line 11 are larger than the width of the semiconductor layer 14. Further, the entirety of the semiconductor layer 14 overlaps with the light-shielding conductor 17 and the gate electrode line 11. This can prevent exposure of the semiconductor layer 14 toward a light with more reliability.

As illustrated in FIG. 2 and FIG. 4, the width of the light-shielding conductor 17 in this example corresponds to the width of the gate electrode line 11. In other words, the width of the light-shielding conductor 17 is equivalent to the width of the gate electrode line 11. Therefore, exposure of the semiconductor layer 14 toward a light can be effectively inhibited without lowering the aperture ratio which is defined by the width of the gate electrode line 11.

Alternatively, the width of the light-shielding conductor 17 may be larger than the width of the gate electrode line 11. This structure can more effectively inhibit exposure of the semiconductor layer 14 toward outside light or ultraviolet ray used in forming the alignment film 27. This structure is especially effective when the distance between the light-shielding conductor 17 and the semiconductor layer 14 is larger than the distance between the gate electrode line 11 and the semiconductor layer 14 as illustrated in FIG. 3. Further, traveling of outside light or ultraviolet ray toward the semiconductor layer 14 after being reflected by the gate electrode line 11 can be inhibited more effectively.

Contrarily, the width of the gate electrode line 11 may be larger than the width of the light-shielding conductor 17. According to this structure, exposure of the semiconductor layer 14 toward the light from the backlight device 102 can be inhibited more effectively. Further, traveling of light from the backlight device 102 toward the semiconductor layer 14 after being reflected by the light-shielding conductor 17 can be inhibited more effectively.

As illustrated in FIG. 3 and FIG. 4, the light-shielding conductor 17 and the common electrode 16 are formed in a layer which is lower than the pixel electrode 15. In other words, the light-shielding conductor 17 and the common electrode 16 are formed in a layer which is nearer to the semiconductor layer 14 and the first transparent substrate 10 than the pixel electrode 15 is. In such a structure, compared with a structure in which the light-shielding conductor 17 and the common electrode 16 are formed in a layer which is higher than the pixel electrode 15, the distance between the light-shielding conductor 17 and the semiconductor layer 14 becomes smaller. As a result, exposure of the semiconductor layer 14 toward outside light or ultraviolet ray used in forming the alignment film 27 can be inhibited more effectively.

In this example, as illustrated in FIG. 3, the insulating film 24 is formed on the second protective insulating film 23. The common electrode 16 is formed on the insulating film 24. The common electrode 16 and the light-shielding conductor 17 are covered with the insulating film 25. The insulating films 24 and 25 are, for example, nitride films (for example, silicon nitride). The pixel electrode 15 is formed on the insulating film 25, and is covered with the alignment film 27. A through hole h1 is formed in the insulating films 24 and 25. An opening is formed in the common electrode 16, while avoiding the position of the through hole h1. The pixel electrode 15 is connected to an end of the drain electrode 13a via the through hole h1.

Figure 5:
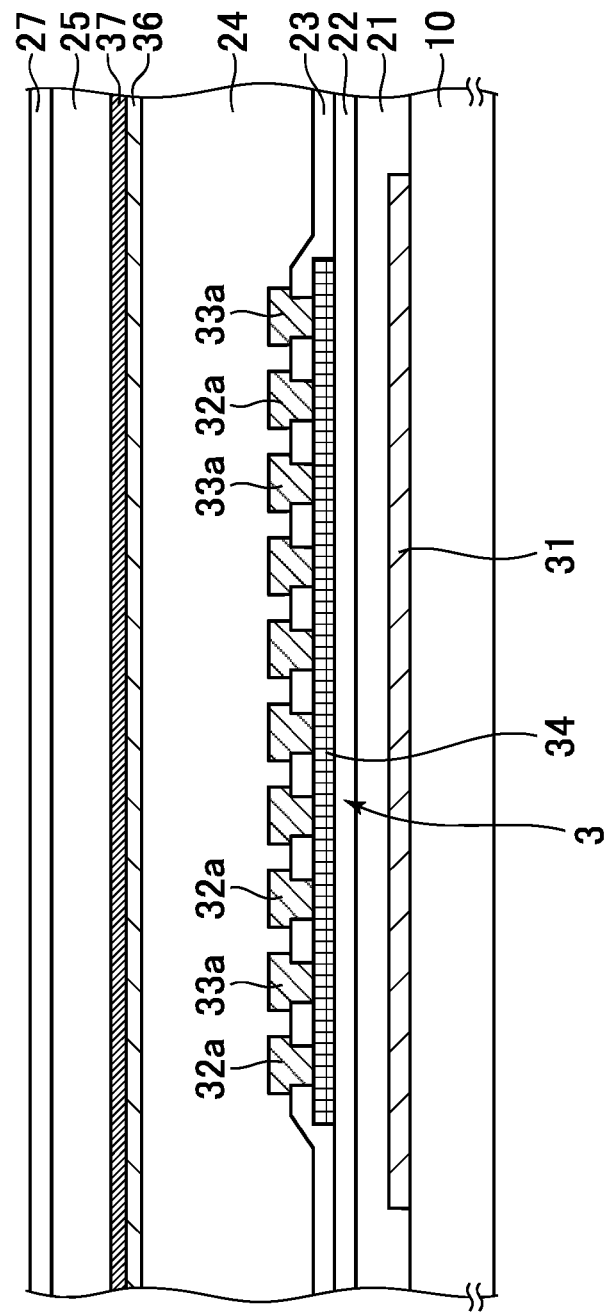
FIG. 5 is a sectional view of the first transparent substrate taken along the line V-V of FIG. 2.
Figure 6:
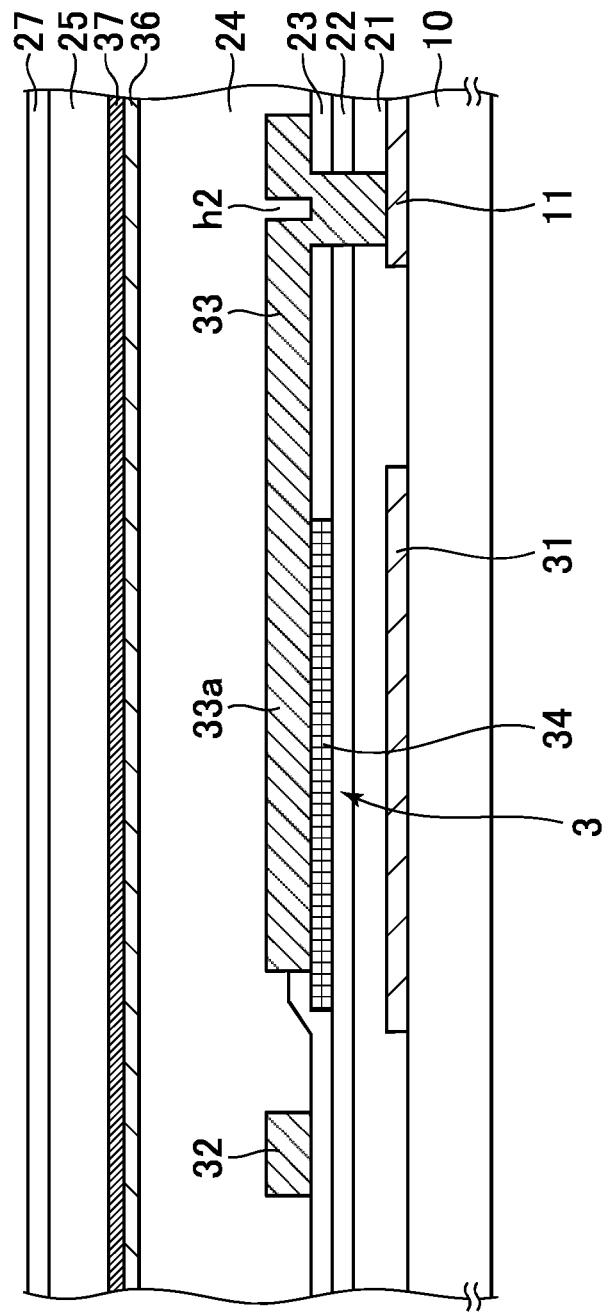
FIG. 6 is a sectional view of the first transparent substrate taken along the line VI-VI of FIG. 2.

The structure of the peripheral region of the first transparent substrate 10 will be described. FIG. 5 is a sectional view of the first transparent substrate 10 taken along the line V-V of FIG. 2, and FIG. 6 is a sectional view of the first transparent substrate 10 taken along the line VI-VI of FIG. 2.

As illustrated in FIG. 2, a thin film transistor (hereinafter referred to as TFT 3) forming the shift register circuit of the gate driver circuit 104 is formed in the peripheral region of the first transparent substrate 10. Further, a gate electrode line 31 which functions as a gate of the TFT 3 is formed in the peripheral region. The gate electrode line 31 in this example extends in the same direction as the gate electrode line 11. The gate electrode line 31 is covered with the gate insulating film 21 (see FIG. 5 and FIG. 6).

The TFT 3 is connected to an end of the gate electrode line 11. Specifically, as illustrated in FIG. 2, the drain electrode line 33 and the source electrode line 32 which are located on opposite sides across the gate electrode line 11 are formed in the peripheral region. The TFT 3 is connected to the end of the gate electrode line 11 via the drain electrode line 33. The drain electrode line and the source electrode line 32 are, similarly to the above-mentioned drain electrode 13a and the source electrode line 12, formed on the second protective insulating film 23. As illustrated in FIG. 6, a drain electrode 33a is connected to the gate electrode line 11 via a through hole h2 formed in the protective insulating films 22 and 23 and in the gate insulating film 21.

As illustrated in FIG. 5, the TFT 3 includes the semiconductor layer 34 which functions as the channel portion. The semiconductor layer 34 is located above the gate electrode line 31. Specifically, the semiconductor layer 34 overlaps with the gate electrode line 31. The width of the gate electrode line 31 is larger than the width of the semiconductor layer 34, and the entirety of the semiconductor layer 34 overlaps with the gate electrode line 31. The gate electrode line 31 is, similarly to the gate electrode line 11, formed of a material which has light-shielding property (for example, Cu or Al). Therefore, the gate electrode line 31 prevents exposure the semiconductor layer 34 toward a light. In this example, the semiconductor layer 34 is formed on the first protective insulating film 22, and is covered with the second protective insulating film 23.

As illustrated in FIG. 5, the TFT 3 includes source electrodes 32a and the drain electrodes 33a. The source electrode 32a extends from the source electrode line 32 to the drain electrode line 33. The drain electrode 33a extends from the drain electrode line 33 to the source electrode line 32. The electrodes 32a and 33a are formed on the second protective insulating film 23 (see FIG. 6), and are connected to the semiconductor layer 34 via through holes formed in the second protective insulating film 23.

As illustrated in FIG. 5, the TFT 3 in this example includes a plurality of source electrodes 32a which are parallel with one another and a plurality of drain electrodes 33a which are parallel with one another. The source electrodes 32a and the drain electrodes 33a are alternately provided in the direction of extension of the gate electrode line 31. This structure can improve the operation performance of the TFT 3. For example, the operation speed of the TFT 3 can be increased, or a current which passes through the TFT 3 can be increased. Alternatively, the TFT 3 is not necessarily required to include the alternately provided plurality of source electrodes 32a and plurality of drain electrodes 33a.

The semiconductor layer 34 is, similarly to the semiconductor layer 14, formed of an oxide semiconductor. Specifically, the semiconductor layer 34 is formed of a transparent amorphous oxide semiconductor. In the peripheral region, an electrode 36 formed of a transparent conductive material similarly to the case of the common electrode 16 is formed. The electrode 36 includes a portion located above the semiconductor layer 34 (a portion overlapping with the semiconductor layer 34), and covers the semiconductor layer 34. The electrode 36 in this example is connected to the common electrode 16 (the electrode 36 is hereinafter referred to as peripheral common electrode). Therefore, an unnecessary electric field formed by the gate driver circuit 104 including the TFT 3 can be blocked by the peripheral common electrode 36, and, as a result, the effect of the unnecessary electric field on driving of the liquid crystal layer 4 in the pixel region can be inhibited. The peripheral common electrode 36 is formed in the same layer as the common electrode 16. Specifically, the peripheral common electrode 36 is formed on the insulating film 24. Therefore, the peripheral common electrode 36 can be formed together with the common electrode 16 in a step of forming the common electrode 16.

As illustrated in FIG. 5, a light-shielding conductor 37 is formed on the peripheral common electrode 36 (the light-shielding conductor 37 is hereinafter referred to as peripheral light-shielding conductor). The peripheral light-shielding conductor 37 and the peripheral common electrode 36 are held in contact with each other. The peripheral light-shielding conductor 37 is, similarly to the light-shielding conductor 17, formed of a material which has a conductivity higher than that of the transparent conductive material used as the material of the common electrodes 16 and 36 and which has light-shielding property. The satisfactory conductivity of the light-shielding conductor 37 can lower the resistances of the common electrodes 16 and 36. As a result, non-uniformity of the electric potentials of the common electrodes 16 and 36 can be inhibited.

As illustrated in FIG. 2, the peripheral light-shielding conductor 37 is connected to the light-shielding conductor 17. Specifically, the plurality of light-shielding conductors 17 extend from the peripheral light-shielding conductor 37 in the direction of extension of the gate electrode line 11. Therefore, non-uniformity of the electric potentials of the common electrodes 16 and 36 can be inhibited more effectively. The peripheral light-shielding conductor 37 is formed in the same layer as the light-shielding conductor 17. Therefore, the peripheral light-shielding conductor 37 can be formed together with the light-shielding conductor 17 in a step of forming the light-shielding conductor 17.

As described above, the peripheral light-shielding conductor 37 is formed of a material which has light-shielding property. As illustrated in FIG. 5 and FIG. 6, the peripheral light-shielding conductor 37 is located above the semiconductor layer 34 and covers the semiconductor layer 34. Specifically, the peripheral light-shielding conductor 37 includes a portion which overlaps with the semiconductor layer 34. Therefore, exposure of the semiconductor layer 34 toward a light can be prevented. In this example, the peripheral light-shielding conductor 37 is located in a layer which is lower than the alignment film 27. Therefore, exposure of the semiconductor layer 34 toward ultraviolet ray used in forming the alignment film 27 can be prevented.

The peripheral common electrode 36 and the peripheral light-shielding conductor 37 in this example extend in a direction orthogonal to the direction of extension of the gate electrode line 11 (Y direction in FIG. 2), that is, in the direction of extension of the source electrode line 12. As described above, the light-shielding conductor 17 formed in the display region extends in the direction of extension of the gate electrode line 11. In other words, the peripheral common electrode 36 and the peripheral light-shielding conductor 37 extend in the direction orthogonal to the direction of extension of the light-shielding conductor 17 and of the gate electrode line 11. Therefore, non-uniformity of the electric potential of the common electrode 16 can be inhibited both in the X direction and in the Y direction illustrated in FIG. 2. Further, by using the peripheral light-shielding conductor 37, an electric line which extends along the source electrode line 12 for lowering the resistance of the common electrode 16 (common electrode line which is connected to the common electrode via a through hole) is not necessarily required inside the display region. As a result, the aperture ratio of the pixel can be increased. Further, a portion between two gate electrode lines 31 adjacent to each other is also covered with the peripheral light-shielding conductor 37. Therefore, exposure of the semiconductor layer 34 toward a light can be inhibited more effectively.

Further, this embodiment is advantageous with regard to a liquid crystal display panel having the following structure. The common electrode line is located in the peripheral region and is formed along an edge of the display region. Further, the common electrode line is formed in the layer of the source electrode line 12 or in the layer of the gate electrode line 11. The TFT 3 in the peripheral region is formed outside the common electrode line. In this structure, the TFT 3 is located to the outside by the width of the common electrode line, and thus, the width of the peripheral region in the lateral direction becomes larger. On other hands, in this embodiment, the peripheral light-shielding conductor 37 which lowers the resistance of the common electrode 16 is formed on the common electrode 16, and thus, compared with the case of the above-mentioned structure, the TFT 3 can be formed nearer to the edge of the display region. As a result, the width of the peripheral region, that is, the distance between an edge of the liquid crystal display panel 1 and the edge of the display region can be reduced.

The length of the peripheral light-shielding conductor 37 (length in the Y direction) in this example corresponds to the length of the source electrode line 12. In other words, the length of the peripheral light-shielding conductor 37 is equivalent to the length of the source electrode line 12. Further, as illustrated in FIG. 5, the entirety of the semiconductor layer 34 overlaps with the peripheral light-shielding conductor 37. This can inhibit exposure of the semiconductor layer 34 toward a light with more reliability.

Second Embodiment

Figure 7:
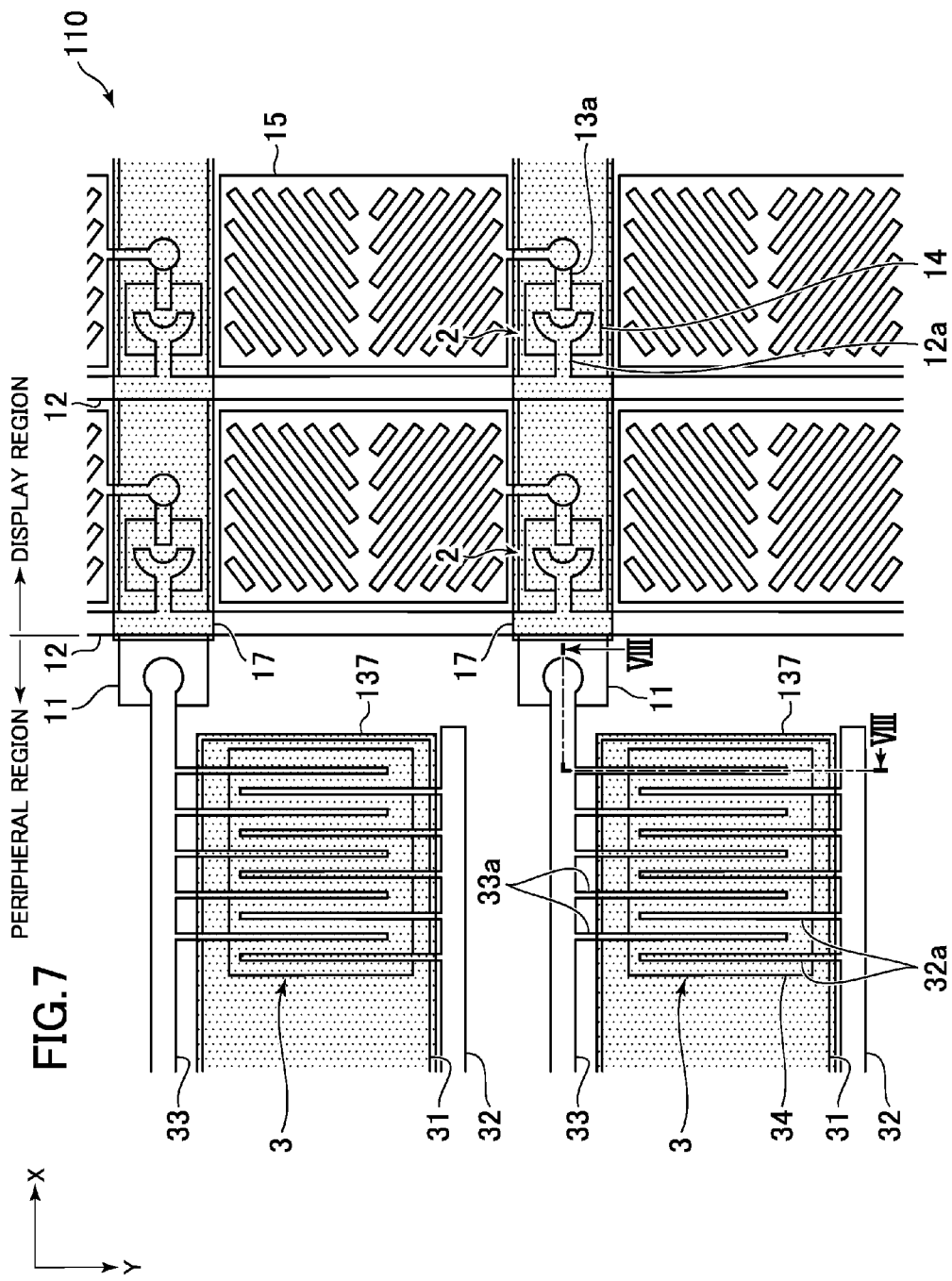
FIG. 7 is a plan view of a first transparent substrate composing a liquid crystal display panel according to a second embodiment of the present invention.
Figure 8:
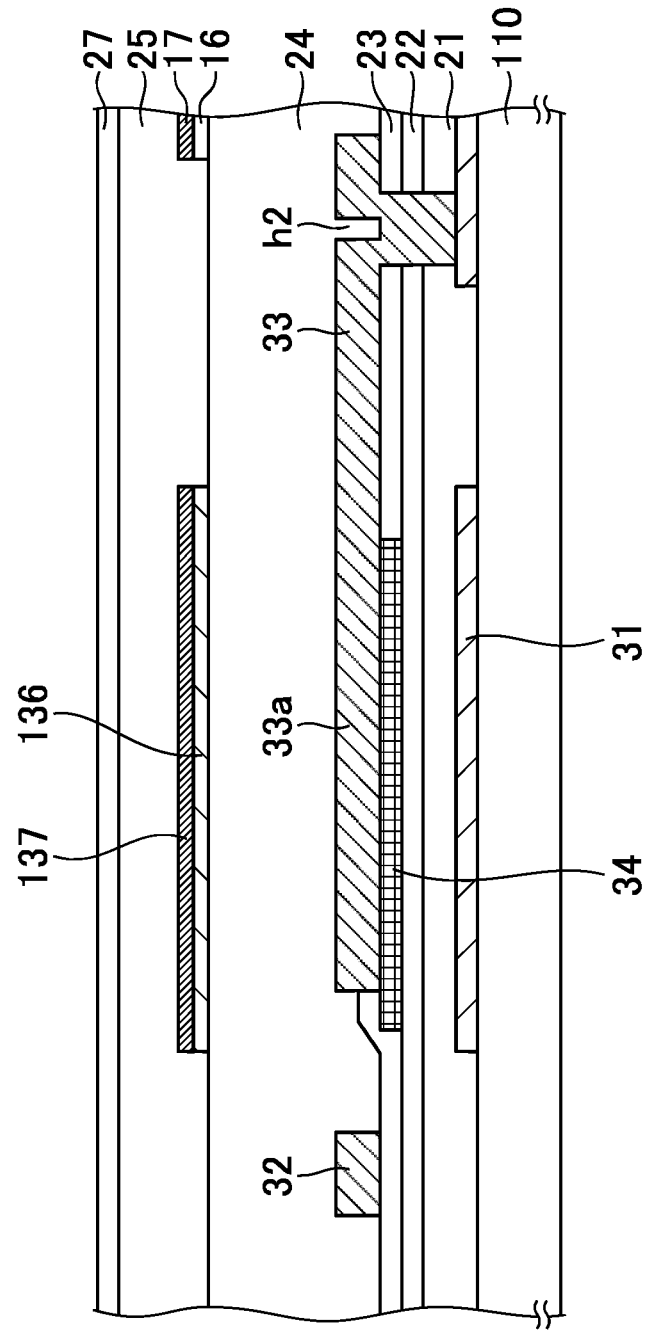
FIG. 8 is a sectional view of the first transparent substrate taken along the line VIII-VIII of FIG. 7.

FIG. 7 is a plan view of a first transparent substrate 110 forming a liquid crystal display panel according to a second embodiment of the present invention. FIG. 8 is a sectional view of the first transparent substrate 110 taken along the line VIII-VIII of FIG. 7. In these figures, like reference numerals are used to designate like members in the first embodiment.

The structure of the first transparent substrate 110 is different from that of the first transparent substrate 10 in the electrodes and the light-shielding conductor formed in the peripheral region, but other points are similar to those of the first transparent substrate 10. Specifically, the gate electrode line 11, the source electrode line 12, the TFT 2, the pixel electrode 15, the common electrode 16, and the light-shielding conductor 17 are formed in the display region of the first transparent substrate 110. Further, the TFT 3 is formed in the peripheral region of the first transparent substrate 110.

A gate electrode line 136 (hereinafter referred to as second gate electrode line) is formed in the peripheral region of the first transparent substrate 110. The second gate electrode line 136 faces the gate electrode line 31 (hereinafter referred to as first gate electrode line) in the thickness direction of the first transparent substrate 110, and extends in the direction of extension of the gate electrode line 31. The TFT 3 is located between the first gate electrode line 31 and the second gate electrode line 136. A gate voltage for driving the TFT 3 is applied to both of the gate electrode lines 31 and 136. This structure can improve the operation performance of the TFT 3. For example, the operation speed of the TFT 3 can be increased, or a current which passes through the TFT 3 can be increased. The second gate electrode line 136 is, similarly to the above-mentioned common electrode 16, formed of a transparent conductive material. The second gate electrode line 136 is located in the same layer as the common electrode 16. Specifically, the second gate electrode line 136 in this example is formed on the insulating film 24. The second gate electrode line 136 is formed together with the common electrode 16 in the step of forming the common electrode 16. Note that, the gate electrode line 136 is not connected to the common electrode 16.

A light-shielding conductor 137 is formed on the gate electrode line 136. The light-shielding conductor 137 is, similarly to the light-shielding conductor 37, formed of a material which has a conductivity higher than that of the transparent conductive material as the material of the gate electrode line 136 and which has light-shielding property. The satisfactory conductivity of the light-shielding conductor 137 can lower the resistance of the second gate electrode line 136. Note that, the light-shielding conductor 137 is located in the same layer as the light-shielding conductor 17 formed in the display region. Thus, the light-shielding conductor 137 is formed together with the light-shielding conductor 17 in the step of forming the light-shielding conductor 17. The light-shielding conductor 137 is not connected to the light-shielding conductor 17.

The size of the light-shielding conductor 137 corresponds to the size of the second gate electrode line 136. Specifically, the light-shielding conductor 137 and the second gate electrode line 136 have substantially the same width (width in the Y direction). Further, the light-shielding conductor 137 and the second gate electrode line 136 have substantially the same length. Alternatively, the width of the light-shielding conductor 137 may be slightly smaller than the width of the second gate electrode line 136.

As described above, the light-shielding conductor 137 is formed of a material which blocks light. The light-shielding conductor 137 covers the semiconductor layer 34. This inhibits exposure of the semiconductor layer 34 toward a light. For example, exposure of the semiconductor layer 34 toward outside light or ultraviolet ray used in forming the alignment film 27 can be inhibited.

In this example, both the width of the light-shielding conductor 137 and the width of the first gate electrode line 31 are larger than the width of the semiconductor layer 34. Further, the entirety of the semiconductor layer 34 overlaps with the light-shielding conductor 137 and the first gate electrode line 31. This can inhibit exposure of the semiconductor layer 34 toward a light more effectively.

The width of the light-shielding conductor 137 in this example corresponds to the width of the first gate electrode line 31. In other words, the width of the light-shielding conductor 137 is equivalent to the width of the first gate electrode line 31. This secures the function of shielding the semiconductor layer 34 against light.

Alternatively the width of the light-shielding conductor 137 may be larger than the width of the first gate electrode line 31. According to this structure, exposure of the semiconductor layer 34 toward outside light or ultraviolet ray used in forming the alignment film 27 can be inhibited more effectively. Further, the width of the light-shielding conductor 137 may be smaller than the width of the first gate electrode line 31.

As described above, the first transparent substrates 10 and 110 of the liquid crystal display panel 1 have the semiconductor layers 14 and 34 which functions as the channel portions of the TFTs 2 and 3, respectively. The material of the semiconductor layers 14 and 34 is an oxide semiconductor. The electrodes 16, 36, and 136 which are formed of a transparent conductive material and which are located over the semiconductor layers 14 and 34, respectively. The light-shielding conductors 17, 37, and 137 are formed on the electrodes 16, 36, and 136 while covering the semiconductor layers 14 and 34, and are formed of a material which has a conductivity higher than that of the transparent conductive material and which has light-shielding property. According to this structure, exposure of the semiconductor layers 14 and 34 toward a light can be inhibited while the resistances of the electrodes 16, 36, and 136 are lowered.

Note that, the present invention is not limited to the embodiments described above, and various modifications are possible.

For example, the light-shielding conductor 17, 37, or 137 is not necessarily required to be formed in the peripheral region of the first transparent substrate 10.

Further, a light-shielding conductor which covers a semiconductor layer of a TFT composing the source driver circuit 105 may be formed in the peripheral region.

Further, the present invention may be applied to a liquid crystal display panel of the vertical alignment (VA) mode or the twisted nematic (TN) mode, in which a common electrode is formed on the second transparent substrate 40. In this case, a light-shielding conductor (specifically, the above-mentioned light-shielding conductor 37 or light-shielding conductor 137) may be formed only in the peripheral region. Further, the light-shielding conductor may be formed for each pixel electrode formed on the first transparent substrate.

Further, the present invention may be applied not only to a liquid crystal display panel but also to an organic electro luminescence panel (EL panel). Also in this case, by forming a light-shielding conductor on an electrode formed of a transparent conductive material of the organic EL panel, the resistance of the electrode can be lowered.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display panel, comprising:
   a transparent substrate having a thin film transistor formed therein;
   a semiconductor layer formed of an oxide semiconductor, the semiconductor layer functioning as a channel portion of the thin film transistor;
   an electrode formed of a transparent conductive material, the electrode being provided to the transparent substrate and located over the semiconductor layer; and
   a light-shielding conductor formed on the electrode and covering the semiconductor layer, the light-shielding conductor being formed of a material which has a conductivity higher than a conductivity of the transparent conductive material and has a light-shielding property,
   wherein
   the transparent substrate has a pixel electrode formed therein; and the light-shielding conductor and the common electrode are formed in a layer which is lower than the pixel electrode.

2. A display device comprising the display panel according to claim 1.

3. The display panel according to claim 1, wherein:
the thin film transistor is employed as a transistor provided in a pixel of the transparent substrate; and
the electrode is employed as a common electrode.

4. The display panel according to claim 3, wherein:
the transparent substrate has an alignment film formed by photo-alignment treatment; and
the light-shielding conductor is formed in a layer which is lower than the alignment film.

5. The display panel according to claim 3, wherein:
the transparent substrate has a gate electrode line formed therein, the gate electrode line being connected to the thin film transistor; and
the light-shielding conductor extends along the gate electrode line.

6. The display panel according to claim 5, wherein the entirety of the semiconductor layer is covered by the light-shielding conductor and the gate electrode line.

7. A display panel, comprising:
a transparent substrate having a thin film transistor formed therein;
a semiconductor layer formed of an oxide semiconductor, the semiconductor layer functioning as a channel portion of the thin film transistor;
an electrode formed of a transparent conductive material, the electrode being provided to the transparent substrate and located over the semiconductor layer; and
a light-shielding conductor formed on the electrode and covering the semiconductor layer, the light-shielding conductor being formed of a material which has a conductivity higher than a conductivity of the transparent conductive material and has a light-shielding property, wherein:
the transparent substrate has an electrode line formed in a display region thereof;
the thin film transistor is employed as a transistor which is formed in a peripheral region outside the display region and which is connected to an end of the electrode line; and
the light-shielding conductor and the electrode on which the light-shielding conductor is formed cover the semiconductor layer of the thin film transistor formed in the peripheral region.

8. The display panel according to claim 7, wherein:
the transparent substrate has a common electrode formed in the display region thereof; and
the electrode on which the light-shielding conductor is formed is formed in the peripheral region of the transparent substrate and is connected to the common electrode.

9. The display panel according to claim 8, further comprising:
a first thin film transistor provided in a pixel in the display region of the transparent substrate;
a semiconductor layer formed of an oxide semiconductor, the semiconductor layer functioning as a channel portion of the first thin film transistor;
a first light-shielding conductor formed on the common electrode, for covering the semiconductor layer of the first thin film transistor;
a second thin film transistor which functions as the thin film transistor formed in the peripheral region of the transparent substrate; and
a second light-shielding conductor which functions as the light-shielding conductor that covers the semiconductor layer forming the second thin film transistor, the second light-shielding conductor being connected to the first light-shielding conductor.

10. The display panel according to claim 9, wherein:
the first light-shielding conductor extends in a direction of extension of the electrode line; and
the second light-shielding conductor extends in a direction orthogonal to the direction of extension of the electrode line.

11. The display panel according to claim 7, wherein:
the peripheral region of the transparent substrate has a first gate electrode line formed in a layer which is lower than the semiconductor layer; and a second gate electrode line which faces the first gate electrode line in a thickness direction of the transparent substrate and which functions as the electrode on which the light-shielding conductor is formed.

12. The display panel according to claim 11, further comprising:
a first thin film transistor provided in a pixel in the display region of the transparent substrate;
a semiconductor layer formed of an oxide semiconductor, the semiconductor layer functioning as forming a channel portion of the first thin film transistor;
an electrode formed in the display region of the transparent substrate;
a first light-shielding conductor formed on the electrode in the display region, for covering the semiconductor layer of the first thin film transistor;
a second thin film transistor which functions as the thin film transistor formed in the peripheral region of the transparent substrate; and
a second light-shielding conductor formed on the second gate electrode line, for covering the semiconductor layer forming the second thin film transistor.

* * * * *